INVENTOR.
ALEKSANDAR GOLUBOVIC
BY Harry A. Herbert Jr and
William J. O'Brien
ATTORNEYS 3,530,007

SOLAR CELL INCLUDING ACEANTHRAQUINOXALINE PHOTOSENSITIVE MATERIAL

Aleksandar Golubovic, Arlington, Mass., assignor to the United States of America as represented by the Secretary of the Air Force Filed Dec. 19, 1967, Ser. No. 691,890
Int. Cl. H01l 3/24
U.S. Cl. 136—89 3 Claims

ABSTRACT OF THE DISCLOSURE

A photoelectric device comprising a photoconductive organic layer disposed between and interconnected to two metal electrodes. Upon exposure to illumination, the photoconductive organic material generates a voltage between the electrodes, thus providing a system for use as a solar cell or a photosensitive circuit element. The cell is responsive to distinct wavelengths of incident radiation in the ultra violet, visible and infrared regions.

BACKGROUND OF THE INVENTION

This invention relates to light sensitive devices having an organic material as the active element in converting solar energy into useful low output electrical power. More particularly, this invention concerns itself with organic solar cells responsive to distinct wavelengths of incident radiation in the ultra violet, visible or infrared region for conversion into low power electrical energy.

The conversion of incident radiation energy to useful electrical energy is a well-known phenomenon and has received much attention. Various methods and materials have been intensely investigated. Primarily, various inorganic materials such as galium arsenide and cadmium sulfide have received prominence as photoconductive materials suitable for use as photoelectric devices such as solar batteries and lightmeters. Attempts to produce light sensitive devices based on organic materials have met with little success. Part of this difficulty in securing suitable organic materials is due to those properties of a typical organic compound which either completely negate the possibility of electron transfer through the organic material or prevent it at temperatures below the decomposition point of the organic crystal. These properties which frustrate electronic conductivity in almost all organic materials are very weak intermolecular bonding and, if present at all, narrow and widely spaced electron bands.

Most attempts to produce electronic conductivity in organics have centered on resonance structures, of which the benzene bond due to shifting back and forth of single and double bonds at high frequency, permits the motion of electrons around the ring, and it has been postulated that if this resonance path were very long, as in polynuclear aromatic structures, electronic conductivity could then be realized. This effect has already been produced to some extent in certain dyes, notably phthalocyanin metal complexes, but only at highly elevated temperatures which are unattainable for present practical usage. It is obvious then, that the outlook for developing light sensitive devices having organic materials as the active element is less than favorable.

With the present invention, however, it has been found that the proper utilization of certain organic compounds or combinations of organic compounds make feasible the formation of a successful photocell capable of creating a photovoltage in response to illumination, thus providing a system for use as a solar battery or as a photosensitive circuit element. The organic photocell of this invention is considerably more economical than the presently known inorganic and elemental devices now under development due both to the wider variety of starting materials which may be used and to ease of manufacture. Also, nonorganic materials must be grown as single crystals and have precisely distributed within them a predetermined amount of impurities in order to create the photosensitive material. The organic photocell herein described, however, is a single system, the manufacture of which is not dependent on delicate crystal growth conditions, and in which photosensitivity is achieved without predetermined impurity dispersion. The simple construction techniques utilized in the formation of the solar cells contribute to favorable weight/power ratios and the capability of such cells for following the absorption properties of applied organics makes it possible to construct tailor-made photosensitive devices responsive to distinct wavelengths of incident radiation. In addition, the fundamental processes in the generation of an electrical potential and current in the photosensitive devices of this invention involve a light induced generation of charge carriers and no chemical or otherwise degradative processes are involved following the absorption of incident radiation. Thus, the devices are ideally suited for use in spacecraft and other electronic devices which may be subjected to the severe environmental condition of high altitude operations.

SUMMARY OF THE INVENTION

In general, the organic photosensitive device of the invention may be described as a three component system comprising a first electrode, a second electrode and a photoconductive organic material or combination of organic materials in intimate contact with the electrodes. By exposing this system to incident radiation, electron transfer takes place and generates a voltage which can be used in any external circuit. The device is prepared by successive fast depositions of the first electrode, one or more deposits of similar or different photoconductive materials and the second electrode on a convenient substrate such as glass, plastic or other transparent solid material. The photoconductive organic materials used for the cell are selected from the group consisting of tetracene, pentacene, aceanthraquinoxaline, 2,7 dinitrofluoren —$\Delta^{9\alpha}$-malononitrile, and triethyltetracyanoquinodimethane complex. Each layer is deposited through an appropriate movable mask divided into three or four parts under high vacuum conditions on the order of $10^{-6}$ mm. of mercury. Thus, the inventtion provides a simple and convenient method for forming solar cells having an organic material as an active element for converting incident radiation energies to electrical energy.

It is the primary object of this invention, therefore, to provide an organic cell responsive to illumination.

It is another object of this invention to provide an organic photoelectric cell of simple manufacture.

It is a further object of this invention to provide an inexpensively produced organic system which produces an electric potential on exposure to visible light, ultra violet or near infrared radiation.

It is still another object of this invention to provide an organic system which acts a sensitive light detecting device by the production of a voltage on exposure to light.

Other objects and advantages of the invention will become apparent upon consideration of the following detailed description thereof taken in conjunction with the accompanying drawings.

DESCRIPTION OF THE DRAWINGS

In the drawings, the figures represent illustrative embodiments of the invention.

In both figures, like elements are represented by like numerals.

DESCRIPTION OF THE PREFERRED EMBODIMENTS

Figure 1:
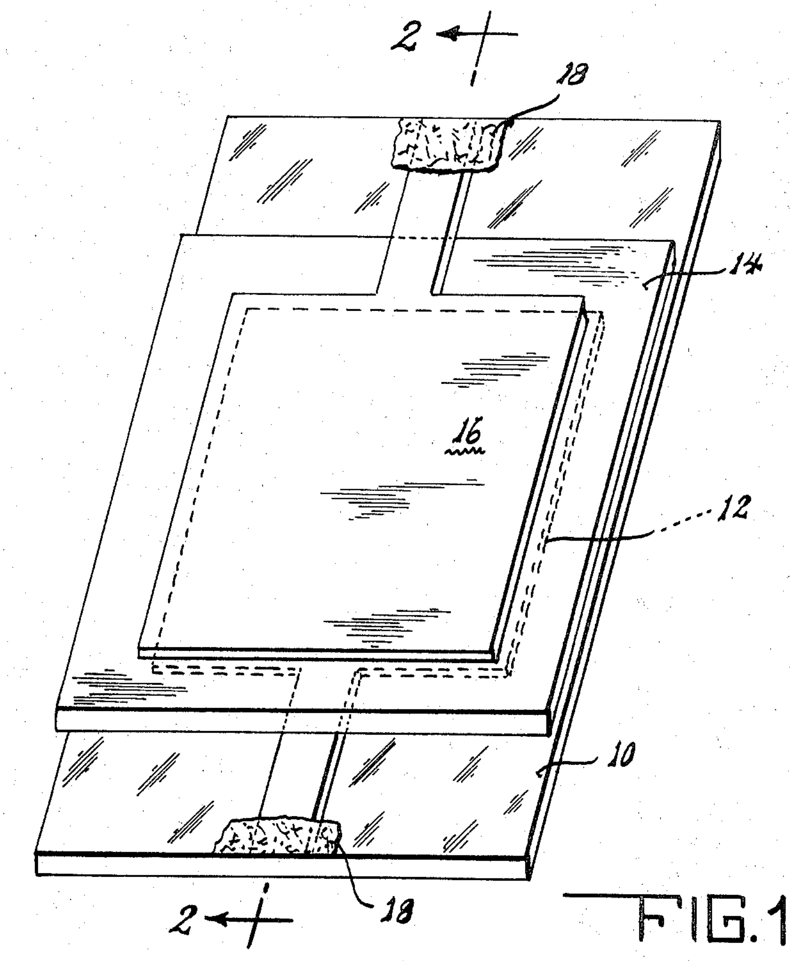
FIG. 1 is an isometric view of a photoelectric cell built in accordance with this invention.
Figure 2:
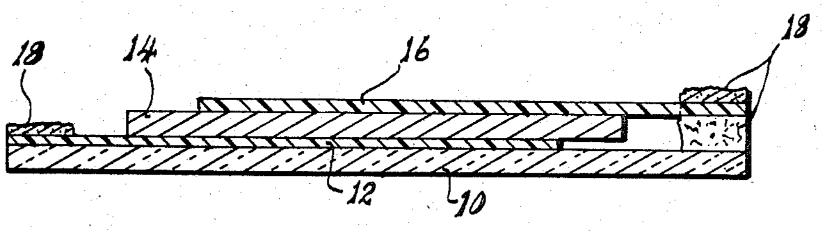
FIG. 2 is a view in section of the cell illustrated in FIG. 1.

Referring to FIG. 1, there is shown a solar cell comprising a transparent substrate 10 made of glass, quartz, mica, plastic or other suitable light transparent substance having electrical insulating properties. The cell is prepared under high vacuum conditions of about $10^{-6}$ mm. of mercury by successive fast depositions of a first or base metal electrode 12, a light sensitive layer 14 consisting of one or more depositions of a similar or different photoconductive organic material and a second or front metal electrode 16. A suitable conducting material 18 such as a silver paste is applied to the electrodes to serve as convenient electrical connections for electrical leads not shown. A transparent conductive glass or plastic could also be used as a combination base electrode and substrate rather than utilizing a separate electrode 12 and substrate 10 as described heretofore.

The electrodes 12 and 16 in any single cell are of different metals or other conductive materials which differ in their electronegative potential. A very useful combination consists of a transparent aluminum base electrode and a silver or gold front or top electrode. Deposition of the photoconductive organic thin layer 14 is best achieved by fast evaporation from a stainless steel cup in high vacuum ($<10^{-5}$ mm. Hg) applying a temperature close to the melting point of the organic material. Under such conditions a very thin (1–50$\mu$) pinhole-free layer is obtained, the surface of which is glassy smooth. Such a surface facilitates the direct deposition of the top electrode 16. Each layer is deposited through an appropriate movable mask divided into three or four parts.

The organic materials used for the preparation of the photoconductive cells are essentially intrinsic photoconductive semiconductors and of different basic chemical structures such as fused aromatic systems, azoaromatic systems and photoconductive dyes. In cells with double organic layers, the combination of an organic photoconductor with charge transfer complexes, metal complexes and free radicals is used.

The following examples of various organic solar cells prepared in accordance with the foregoing principles may better serve to illustrate the present invention.

EXAMPLE 1

Substrate: Glass
Base electrode: Aluminum 20% transparency
Organic material: Aceanthraquinoxaline (chromatographically pure)
Front electrode: Gold The aluminum electrode was negative and this cell produced an open voltage of 1.06 volts and a current of $.345\times10^{-6}$ amperes/cm.$^2$.

EXAMPLE 2

Substrate: Glass
Base electrode: Aluminum 23.8% transparency
Organic material: Tetracene (crystallized from Xylene)
Front electrode: Gold The aluminum electrode was negative and this all produced an open voltage of 1.0 and a current of $.775\times10^{-6}$ amperes/cm.$^2$.

EXAMPLE 3

Substrate: Glass
Base electrode: Aluminum 14.3% transparency
Organic material: Pentacene
Front electrode: Gold The aluminum electrode was negative and this cell produced an open voltage of .75 and a current $.537\times10^{-6}$ amperes/cm.$^2$.

EXAMPLE 4

Substrate: Glass
Base electrode: Aluminum 23.10% transparency
Organic material: 1st layer-aceanthraquinoxaline;; 2d layer-layer obtained by the sublimation of TEA+(TCNQ−) (TCNQ) ion radical complex salt.
Front electrode: Gold The aluminum electrode is negative and this cell produced an open voltage of .79 volts and a current of $.750\times10^{-6}$ amperes/cm.$^2$.

EXAMPLE 5

Substrate: Glass
Base electrode: Aluminum 10.85% transparency
Organic material: 1st layer-tetracene; 2d layer-sublimed TEA+(TCNQ −) TCNQ
Front electrode: Gold The aluminum electrode is negative and this cell produced an open voltage of .34 volts and a current of $.22\times10^{-5}$ amperes/cm.$^2$.

EXAMPLE 6

Substrate: Glass
Base electrode: Aluminum 27.65% transparency
Organic material: 1st layer-tetracene; 2d layer-2,7 dinitrofluoren-$\Delta^{9\alpha}$-malononitrile
Front electrode: Gold The aluminum electrode is negative and this cell produced an open voltage of .85 volts and a current of $.13\times10^{-5}$ amperes/cm.$^2$.

Voltage and current measurements of the cells of Examples 1 through 6 were performed with a Keithley 150A voltmeter and a Keithley 610A electrometer. A quartz iodine lamp of 500 w. was used as a source of radiation and the transparent aluminum electrode of each cell was irradiated with an intensity of about $1.70\times10^6$ ergs./cm.$^2$-sec.

The TEA+(TCNQ−)(TCNQ) organic complex of Examples 4 and 5 is a triethyltetracyanoquinodimethane complex salt containing a molecule of formally neutral TCNQ (7,7,8,8-tetracyanoquinodimethane) and possess a low electrical resistivity. It was prepared in accordance with the syntheses of L. R. Melby et al. as set forth in The Journal of the American Chemical Society 84, 3383 (1962).

The 2,7-dinitrofluoren-$\Delta^{9\alpha}$-malononitrile material of Example 6 was prepared in accordance with the syntheses of T. K. Mukherjee et al. as set forth in the Journal of Physical Chemistry 70, 3848 (1966) and the Journal of Organic Chemistry, 30, 644 (1965).

The following example illustrates the preparation of the novel aceanthraquinoxaline material utilized in the fabrication of the solar cells illustrated in Examples 1 and 4.

EXAMPLE 7

2.3 grams of aceanthraquinone and 1.1 grams of o-phenylene diamine were refluxed in 250 ml. of glacial acetic acid for one-half hour. After cooling to room temperature, the precipitate was filtered, washed with water and dried. The crude microcrystalline product was recrystallized from chloroform and additionally purified by column chromatography using silica gel 0.02–0.5 mm., and chloroform as eluent.

This invention provides a simple and convenient process for manufacturing solar cells prepared from organic materials. When exposed to radiation of wavelengths from 2600 A. to 7000 A., 1 cm.$^2$ in areas, the cells develop open circuit voltages of the order of one volt and generate electrical current of the magnitude of approximately $10^{-6}$ amperes.

While the invention has been described with particularity in reference to specific embodiments thereof, it is to be clearly understood that the disclosure of the present invention is for the purpose of illustration only and is not intended to limit the invention in any way, the scope of which is defined by the appended claims:

What is claimed is:

1. A photoelectric device for generating low output electrical power comprising a first electrically conducting component, a second electrically conducting component and an organic photosensitive material positioned between said first and second components and in intimate ohmic contact therewith, said organic material being responsive to distinct wavelengths of incident radiation and selected from the group consisting of aceanthraquinoxaline, and a first layer of aceanthraquinoxaline and a second layer of a sublimed triethyltetracyanoquinodimethane complex salt.

2. A photoelectric device in accordance with claim 1 wherein said organic material is aceanthraquinoxaline.

3. A photoconductive device in accordance with claim 1 wherein said organic material consists of a first layer of aceanthraquinoxaline and a second layer of a sublimed triethyltetracyanoquinodimethane complex salt.

References Cited

UNITED STATES PATENTS

| | | | |
|---|---|---|---|
| 3,057,947 | 10/1962 | Calvin et al. | 136—89 |
| 3,255,392 | 6/1966 | Wahlig | 252—62.30 X |
| 3,346,444 | 10/1967 | Lupinski et al. | 252—62.30 X |
| 3,403,165 | 9/1968 | Matsunaga | 252—62.30 X |

OTHER REFERENCES

Juster, N. J., Organic Semiconductors, in Journal of Chemical Education, vol. 40, No. 10, October 1963, QD 1–58, pp. 547–554.

ALLEN B. CURTIS, Primary Examiner

U.S. Cl. X.R.

252—62.3